United States Patent [19]

Kawama et al.

[11] Patent Number: 5,725,006
[45] Date of Patent: Mar. 10, 1998

[54] SOLAR BATTERY CELL, A SOLAR BATTERY MODULE, AND A SOLAR BATTERY MODULE GROUP

[75] Inventors: Yoshitatsu Kawama; Takashi Ishihara; Satoshi Arimoto; Hiroaki Morikawa; Akihiro Takami; Yoshinori Matsuno; Hideo Naomoto; Yoichiro Nishimoto, all of Amagasaki, Japan

[73] Assignee: Mitsubishi Denki Kabushiki Kaisha, Tokyo, Japan

[21] Appl. No.: 563,420

[22] Filed: Nov. 28, 1995

[30] Foreign Application Priority Data

Jan. 31, 1995 [JP] Japan ................... 7-014189

[51] Int. Cl.⁶ .................. H01L 31/048; H01L 31/052
[52] U.S. Cl. ................ 136/251; 136/256; 257/433; 257/466
[58] Field of Search .................... 136/251, 256; 257/466, 433

[56] References Cited

U.S. PATENT DOCUMENTS

| | | | |
|---|---|---|---|
| 3,844,840 | 10/1974 | Bender | 136/251 |
| 4,322,571 | 3/1982 | Stanbery | 136/255 |
| 4,348,254 | 9/1982 | Lindmayer | 156/647.1 |
| 4,377,722 | 3/1983 | Wested | 136/244 |
| 5,011,544 | 4/1991 | Gaddy et al. | 136/246 |
| 5,213,626 | 5/1993 | Paetz | 136/244 |

FOREIGN PATENT DOCUMENTS

| | | | |
|---|---|---|---|
| 63-143878 | 6/1988 | Japan | 136/256 |
| 4-223378 | 8/1992 | Japan | 136/256 |
| 5-235385 | 9/1993 | Japan | 136/256 |
| 5-308148 | 11/1993 | Japan | 136/259 |
| 5-93057 | 12/1993 | Japan | 136/257 |
| 6-37343 | 2/1994 | Japan | . |

OTHER PUBLICATIONS

S.G. Bailey et al, *Conference Record, 19th IEEE Photoro-Haic* Specialists Conf. (1987), pp. 421–426.

*Primary Examiner*—Aaron Weisstuch
*Attorney, Agent, or Firm*—Lowe, Price, LeBlanc & Becker

[57] ABSTRACT

A solar battery cell, solar battery module, and solar battery module group achieving high product value by enabling the display of surface patterns without reducing the power generating efficiency of the solar battery cells are provided. The direction and/or reflectance of reflected light incident to the surface of the solar battery cell are varied by controlling the distribution of the rough surface structure imparted to the solar battery cell surface. The direction or reflectance of reflected light incident to the surface of the solar battery cell is changed in part depending upon the part of the semiconductor solar battery cell surface to which the light is incident. Semiconductor solar battery cells with high product value can therefore be achieved because patterns with strong visual impact can be displayed and easily recognized without reducing the power generation efficiency of the solar battery cell.

18 Claims, 19 Drawing Sheets

SOLAR BATTERY CELL, A SOLAR BATTERY MODULE, AND A SOLAR BATTERY MODULE GROUP

BACKGROUND OF THE INVENTION

1. Field of the Invention

The present invention relates to a solar battery cell, to a solar battery module comprising a plurality of said solar battery cells, and a solar battery module group comprising a plurality of said solar battery modules. In particular, the present invention relates to a solar battery cell, a solar battery module, and a solar battery module group providing high added-value by means of enabling the display of patterns on the surface of the solar battery.

2. Description of the Prior Art

FIG. 24A is a plan view and FIG. 24B is a cross sectional view of the structure of a solar battery according to the prior art. As shown in these figures, light irradiating from above passes through the antireflection film 113 of a solar battery 101 having a rough surface structure 112, and is incident upon the power generation layer 104, which is typically a semiconducting material. The photoelectric current produced by the power generation layer 104 can then be supplied to an external load (circuit) not shown in the figures from a p-type electrode 114 and an n-type electrode 115.

To improve the generating efficiency of the solar battery 101, the incident light contributing to power generation must be conducted to the power generation layer with as little loss as possible. To achieve this, a rough surface structure 112 comprising a continuous series of inclined surfaces is provided on the surface of the solar battery 101, and this rough surface structure 112 is coated with an antireflection film 113 to suppress surface reflection of the incident light. The surface of the solar battery 101 therefore appears to be a dark monotone color ranging from blue to violet with no distinguishing surface pattern.

Various attempts have also been made to increase the product value of the solar battery by adding visual added-value to solar batteries installed in outdoor locations. It is possible, for example, to achieve various patterns on the surface of the solar battery 101 by selectively removing parts of the antireflection film 113, or by varying the pattern of the surface electrodes. Each of these methods, however, either changes the amount of light passing through the surface to the solar battery 101, or makes it impossible to achieve an optimal electrode pattern with high collecting efficiency. As a result, power generation efficiency varies, output drops, and even the content displayable by the pattern (the maximum removable area) is limited. It is also necessary for the visible light reflected from the surface to be strong to improve the contrast of the pattern, thereby greatly reducing the power generation efficiency of the solar battery.

FIG. 25 is a side view illustrating part of the structure of a colored solar battery according to the prior art as described in Japanese Utility Model Publication No. 5-93057 and comprising a wavelength-selective diffusion layer 100 on the front surface of the solar battery 1. In this example, the wavelength-selective diffusion layer 100 is a cholesteric polymer sheet. Par of the diffused light scattered by the wavelength-selective diffusion layer 100 can be seen from any position above he wavelength-selective diffusion layer 100, and the solar battery 101 thus appear colorful. The wavelength-selective diffusion layer 100 is also constituted such that the light passing the wavelength-selective diffusion layer 100 has a high content of light in the wavelength band contributing to power generation by the solar battery. As a result, the power generation efficiency of this solar battery does not drop noticeably.

FIG. 26 is a cross section of the structure of a solar battery according to the prior art as described in Japanese Published Application No. 5-308148. The solar battery 101 shown in this figure comprises a transparent electrode 103, a photoelectric conversion element (corresponding to the power generation layer) 104, and a back electrode 105 laminated in sequence over a glass substrate 102. A rough surface pattern 106 for spectral reflection of solar light is also provided at the interface between the glass substrate 102 and the transparent electrode 103. When solar light is incident to the rough surface pattern 106, the light reflected from the rough surface pattern 106 is spectrally reflected by light diffraction, and is apparent as a rainbow of color.

Formation of this rough surface pattern is also not limited to the entire interface between the glass substrate 102 and transparent electrode 103. Specifically, as shown in FIGS. 27 and 28, the pattern may be formed at selected parts of this or other layer interfaces. Furthermore, these rough surface patterns can be achieved by etching the pattern into the surface of the glass substrate 102 (in the example shown in FIG. 26) using laser etching, ion etching, or other etching method using a mask pattern, and then sequentially forming the transparent electrode 103 and other layers to build the solar battery 101.

A plan view of an innovative solar battery apparatus comprising plural solar batteries arrayed in series according to Japanese Published Application No. 6-37343 is shown in FIG. 29. The solar battery cells 116 and 117 are of different types, achieved by coloring, varying the thickness of, or varying the material of the antireflection coating, for example, on the cell surfaces to control the wavelength of the reflected light at the cell surface. These differently reflecting solar battery cells 116 and 117 are then arrayed in the desired two-dimensional pattern as shown.

Because solar batteries according to the prior art are built as described above, the amount of light contributing to power generation is unavoidably reduced in the areas of the pattern, and the power generation efficiency of the solar battery is therefore reduced, even when color filters with characteristics similar to those of the wavelength-selective diffusion layer 100 are used. Furthermore, it is known that use of such filters also varies some of the wavelengths contributing to power generation, and this contributes to a further reduction in the power generation efficiency.

In addition, the wavelength-selective diffusion layer 100 is a polymer sheet, the transmittance of which deteriorates over time, thus further reducing the power generation efficiency of the solar battery.

Providing the rough surface pattern 106 in selected parts of the solar battery structure requires an additional manufacturing process to form the rough surface pattern 106, thereby complicating the manufacturing process. The rough surface pattern 106 diffracting and dispersing the reflected light is also another factor reducing the power generation efficiency of the solar battery.

Conventional solar batteries also array plural cells of differing color, thickness, or material used for the antireflection film in a two-dimensional pattern. Inevitably these various cells include cells with higher reflectance than that of cells with an optimally designed antireflection film, thus reducing the total power efficiency of the solar battery. The color difference that can be achieved with this method is also limited, and contrast is relatively poor, thus resulting in two-dimensional patterns with little visual impact.

SUMMARY OF THE INVENTION

Therefore, an object of the present invention is to resolve these problems of the prior art by providing a solar battery cell, a solar battery module, and a solar battery module group having a surface pattern of strong visual impact providing high product value without reducing the power generation efficiency by partially changing the reflectance or reflecting direction of light at the solar battery surface.

According to the first aspect of the present invention, there is provided a solar battery cell wherein photoelectric current generated from light incident upon a power generation layer is obtained, which comprises an electrode formed on the power generation layer for outputting the photoelectric current to an external lead, and a means for changing the reflecting direction of the incident light according to the area of the power generation layer surface to which the light is incident.

In a preferred embodiment, a solar battery cell is provided wherein the means for changing the reflecting direction in the surface of the power generation layer is achieved by changing the surface configuration of the power generation layer.

In another preferred embodiment, a solar battery cell is characterized by the surface of the power generation layer comprising smooth areas and rough areas.

In a still other preferred embodiment, a solar battery cell is characterized by the surface of the power generation layer comprising a combination of differing rough structures.

In a further preferred embodiment, a solar battery cell is provided wherein the rough areas comprise groups of quadrangular pyramidal projections.

In a still further preferred embodiment, a solar battery cell is a solar battery cell wherein the rough areas comprise groups of quadrangular pyramidal indentations.

In a still further preferred embodiment, a solar battery cell is a solar battery cell wherein the rough areas comprise V-shaped channels.

In a still further preferred embodiment, a solar battery cell is a solar battery cell wherein the angles of the surfaces forming the rough areas are varied.

In a still further preferred embodiment, a solar battery cell is a solar battery cell wherein the electrode disposed to the power generation layer is a transparent electrode.

In a more further preferred embodiment, a solar battery cell is a solar battery cell wherein the electrodes are formed on the surface opposite the surface to which light is incident.

According to the second aspect of the present invention, there is provided a solar battery module comprising a plurality of solar battery cells whereby a photoelectric current generated from light incident upon a power generation layer is obtained by an external load from an electrode formed on the power generation layer arrayed on a particular substrate, which comprises a glass substrate placed over the plurality of solar battery cells arrayed on said particular substrate, a resin filling the gap between the glass substrate and the particular substrate, and a frame securing the resin and solar battery cells arrayed between the glass substrate and the particular substrate; wherein the plurality of arrayed solar battery cells are either solar battery cells which reflect the light incident thereto in different directions, or solar battery cells wherein the direction of incidence light reflection varies within each cell.

In a preferred embodiment, a solar battery module is a solar battery module wherein the power generation layer of the solar battery cells is a semiconductor comprising differing crystal characteristics.

In another preferred embodiment, a solar battery module is a solar battery module wherein the semiconductor comprising differing crystal characteristics comprises a single-crystal silicon and a polycrystalline silicon.

In a still other preferred embodiment, a solar battery module is a solar battery module wherein the disposition angles of the plural solar battery cells arrayed to the particular substrate differ.

In a further preferred embodiment, a solar battery module further comprises coloring or shading in at least one of the constituent components of the solar battery module, specifically the particular substrate, to frame, or the resin filled between the solar battery cells and the particular substrate.

According to the third aspect of the present invention, there is provide a solar battery module group comprising plural solar battery modules in a planar array. Each of the solar battery modules comprises a plurality of solar battery cells wherein photoelectric current generated from light incident upon the power generation layer is obtained by an external load from an electrode formed on the power generation layer arrayed on a particular substrate, a glass substrate placed over the plurality of solar battery cells arrayed on said particular substrate, a resin filling the gap between the glass substrate and the particular substrate, and a frame securing the resin and solar battery cells arrayed between the glass substrate and the particular substrate. The solar battery module group is characterized by the plural arrayed solar battery modules wherein each individual module reflects light incident thereto in one direction and different modules reflect light in different directions, or solar battery modules wherein the component solar battery cells thereof individually reflect the light incident thereto in different directions.

When the solar battery cell comprises the means for changing the reflecting direction of the incident light according to the area of the power generation layer surface to which the light is incident, the distribution of reflected light varies according to the location of the observer. Accordingly, it is therefore possible, without reducing the power generation of the solar battery cell reflecting patterns that differ according to the position from which the reflected light is viewed, to display a variety of patterns on the solar battery cell, and to improve the product value while maintaining solar battery cell functionality.

The direction of reflection can be readily changed because the means for changing the reflecting direction of the incident light according to the area of the power generation layer surface to which the light is incident is achieved by changing the surface configuration of the power generation layer. By thus selecting a surface configuration with a range of configurations not degrading solar battery cell functionality, a variety of patterns can be displayed on the solar battery cell, and product value can be improved while maintaining solar battery cell functionality.

When the surface of the power generation layer comprises smooth areas and rough areas, the variably smooth and rough surface can be obtained by etching the surface of the power generation layer using a simple mask, and the direction of reflected light can thus be easily changed by said smooth areas and rough areas. Accordingly, surface areas of different textures can thus be created by means of a simple process, and solar battery cells with high product value can be achieved at low cost without degrading solar battery cell functionality.

If a solar battery cell comprises a combination of differing rough structures in the surface of the power generation layer, the surface structure can also be easily obtained by repeated masking and etching operations, and the direction of reflected light can thus be easily changed. The surface areas of different textures can be created by means of a simple process using plural etching masks, and solar battery cells with high product value can be achieved at low cost without degrading solar battery cell functionality.

In applications where the solar battery cell comprises groups of quadrangular pyramidal projections or indentations in the rough areas of the surface of the power generation layer, this structure can be easily obtained by etching with a simple pattern mask. It is therefore possible to distribute the reflected light in four directions, and solar battery cells with high product value can be achieved at low cost without degrading solar battery cell functionality.

Also, when the solar battery cell comprises V-shaped channels in the rough areas of the surface of the power generation layer, this structure can be easily obtained by etching with a simple pattern mask, and the direction of reflection can be easily designed and controlled. It is therefore possible to distribute the reflected light in two controlled directions, and solar battery cells with high product value can be achieved at low cost without degrading solar battery cell functionality.

When a transparent electrode is formed on the power generation layer or when the electrodes are provided on the surface opposite the surface to which light is incident, no part of the light receiving surface is in the shadow of the electrode, and light can be efficiently received, to thereby suppress the photoelectric conversion loss. Various patterns can therefore be expressed on the solar battery cells without degrading the power generation efficiency irrespective of the electrode shape.

If the solar battery module comprises solar battery cells of which the direction of incidence light reflection differs between cells, or solar battery cells wherein the direction of incident light reflection changes within the cell, in the plurality of arrayed solar battery cells, the distribution of reflected light therefore varies according to the location of the observer, and graphic or textual patterns can therefore be recognized by the observer. The displayed pattern can therefore be freely expressed in the solar battery module, observers can, depending upon the viewing angle, view patterns from modules that are significantly larger than the individual solar battery cells, and solar battery modules of high product value can be achieved while maintaining solar battery cell functionality.

When the solar battery module comprises a semiconductor of differing crystal characteristics for the power generation layer of the solar battery cells, it is possible to control the direction of reflection by controlling the orientation of the crystal faces. It is therefore possible to express various patterns by controlling the orientation of the crystal faces without creating special surface configurations and without degrading functionality.

In applications where single-crystal silicon or polycrystalline silicon is employed, the former acts to reflect light in a constant direction, while the latter acts to scatter the reflected light. It is therefore possible to express various patterns without creating special surface configurations and without degrading functionality due to differences in crystal characteristics.

The angle of the reflected light can be easily controlled because the disposition angles of the plural solar battery cells arrayed on the particular substrate differ. It is therefore possible to express various patterns without degrading functionality by controlling the disposition angles in the module.

If the solar battery module further comprises coloring or shading in at least one of the constituent components of the solar battery module, specifically the particular substrate, the frame, or the resin filled between the solar battery cells and the particular substrate, these parts do not contribute to power generation, the power generation efficiency therefore does not drop, and an observer can recognize the colored or shaded pattern, thus making it possible to achieve a colorful solar battery module with high product value.

When a solar battery module group comprises plural arrayed solar battery modules of which the direction of incidence light reflection differs between modules, or solar battery modules formed of solar battery cells wherein the direction of incidence light reflection changes within the cell, the distribution of reflected light varies according to the location of the observer, and graphic or textual patterns can therefore be recognized by the observer. In addition, the use of a module group makes it possible to display large-scale patterns which can be recognized from a distance by the observer. It is therefore possible to express within the large area of a solar battery module group and without degrading solar battery cell functionality a variety of patterns using a variety of colors, and to improve the product value of the solar battery module group.

BRIEF DESCRIPTION OF THE DRAWINGS

The present invention will become more fully understood from the detailed description given below and the accompanying diagrams wherein.

DESCRIPTION OF PREFERRED EMBODIMENTS

Embodiment 1

Figure 1:
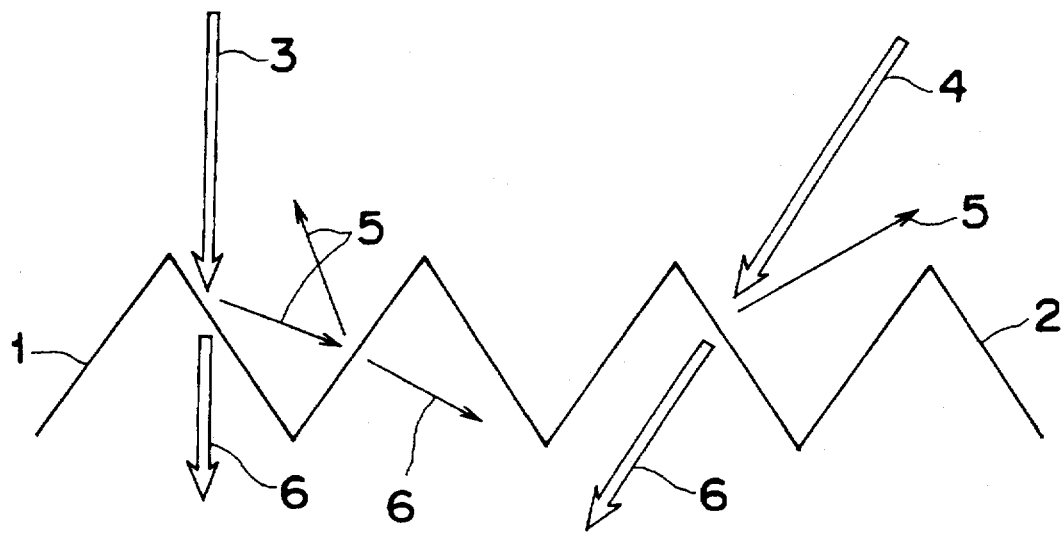
FIG. 1 is used to describe the principle whereby the direction of surface reflections of incident light is controlled in the rough structure of the solar battery surface according to the present invention.

The preferred embodiments of the present invention are described below with reference to the accompanying figures, of which FIG. 1 is used to describe the principle whereby the direction of surface reflections of incident light is controlled in the rough structure of the solar battery surface according to the present invention.

Referring to FIG. 1, incident light 3 irradiated perpendicularly to the solar battery 1 is separated by the rough structure 2 formed on the surface of the solar battery 1. Part of the incident light 3 passes through the rough structure 2, becoming transmitted light 6 transmitted inside the solar battery 1. Another part of the incident light 3 is reflected by the surface of the rough structure 2, becoming reflected light 5. Incident light 4 irradiated at any other angle to the solar battery is similarly separated into transmitted light 6 and reflected light 5. Note that an antireflection film is normally formed on the surface of the rough structure 2 to improve the transmission efficiency of the structure, but for simplicity is omitted in FIG. 1 and in the description below.

When the incident light 3 is perpendicularly incident to a rough structure 2 formed, for example, by an anisotropic etching method, the incident light 3 is reflected twice at the surface, and substantially all of the incident light 3 passes into the solar battery 1 as transmitted light 6. When light is incident at a non-perpendicular angle such as shown by incident light 4 in FIG. 1, the light is reflected only once at the surface, but because the angle of incidence to the incidence surface is near perpendicular, substantially all of the incident light 4 again passes into the solar battery 1 as transmitted light 6. A rough surface structure is therefore used to suppress surface reflection, increase the amount of transmitted light passing into the solar battery 1, and thereby improve the power generation efficiency of the solar battery.

Because the reflecting surfaces of the rough structure 2 are smooth mirror surfaces, and parallel light is incident to the rough structure 2, the nominal reflected light 5 is also substantially parallel. The combined reflected light 5 therefore appears as strong reflected light 5 readily visible to the observer of the solar battery.

Figure 2:
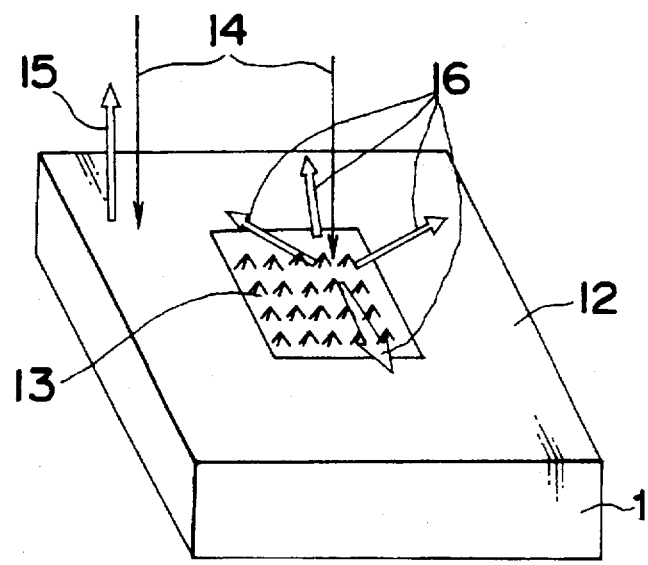
FIG. 2 is used to describe a solar battery cell according to the first embodiment of the present invention.

FIG. 2 is an overview used to describe a solar battery according to a preferred embodiment of the invention. Shown in FIG. 2 is a single solar battery cell approximately ten centimeters (10 cm) square. The antireflection film formed on the surface of the solar battery cell is also omitted from this figure. Note that the surface of this solar battery 1 comprises a smooth area 12 and a rough textured area 13. When incident light 14 is irradiated to this solar battery 1, the reflected light 15 from the sooth area 12 and the reflected light 16 from the textured area 13 are each reflected in different directions. The reflected light 16 from the textured area 13 (the rough surface area) reflects according to the principle described above with reference to FIG. 1. As a result, the observer will perceive either the smooth area reflected light 15 or the rough surface reflected light 16 as a strong reflected light.

Figure 3A:
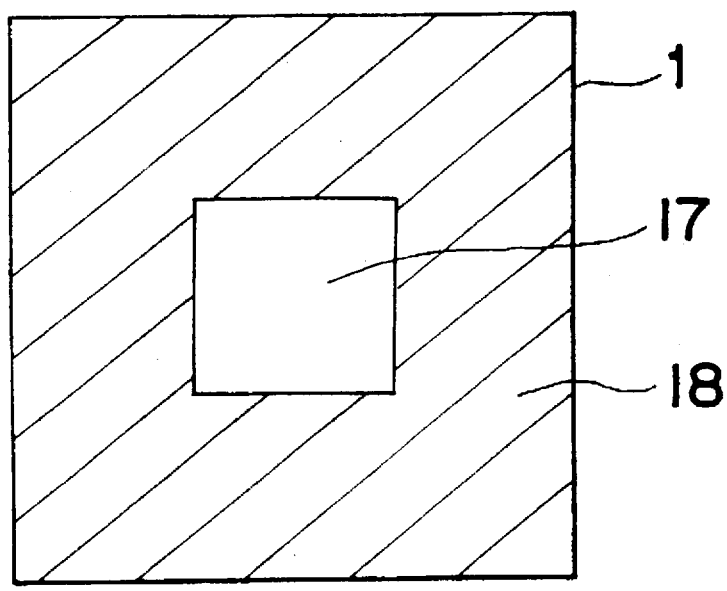
FIGS. 3A and 3B illustrate the patterns of reflected light from a solar battery cell according to the first embodiment of the present invention.
Figure 3B:
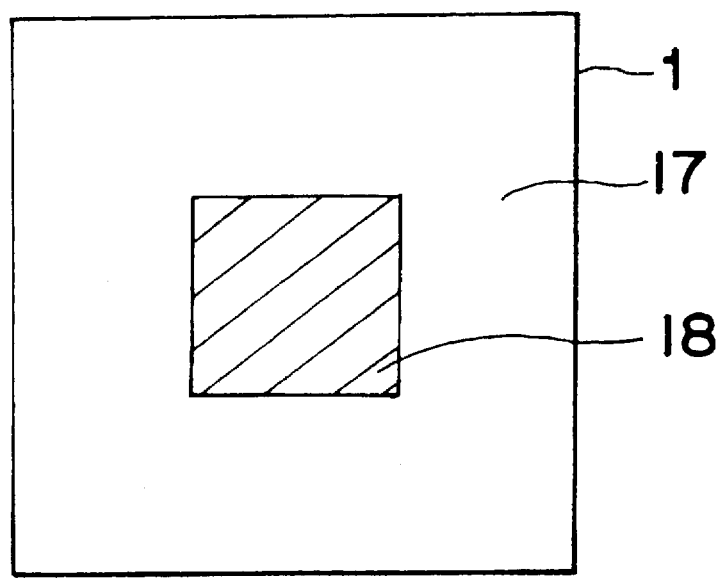

FIG. 3 shows the different patterns that may be recognized when the solar battery in FIG. 2 is observed from two typical directions. As is seen from these figures, the surface pattern is divided into two distinct regions: bright surface area 17 resulting from strong reflected light, and dark surface area 18 from which no light appears to reflect at the observation position. These bright and dark surface areas may change according to the observer position: FIG. 3A represents the pattern observed when the solar battery 1 is viewed from the direction of reflected light 16 in FIG. 2, producing a olid square reflection; FIG. 3B represents the pattern observed when the solar battery 1 is viewed from the direction of reflected light 15 in FIG. 2, producing a frame-like pattern with a square hole in the center.

From the above it will be appreciated that patterns of any desired shape can be created by appropriately arraying the projection groups 13 on the solar battery surface, and a solar battery with visible added-value can be obtained.

A method for forming projections having a quadrangular pyramidal shape as shown in FIG. 2 is described next.

Specifically, the semiconductor material, e.g., silicon, constituting the power generation layer is immersed in an alkaline solution of, for example, potassium hydroxide or sodium hydroxide, and wet etching is used to form the surface pattern. The etching time must be controlled to achieve projections of the desired height. The silicon is preferably a (100) single crystal silicon, or a polycrystalline silicon with the crystal faces oriented to (100). Note that the overall shape of the quadrangular pyramids will be distorted if the facial orientation is offset from (100), but a certain amount of distortion has no practical adverse effect on controlling the reflection direction.

Figure 4:
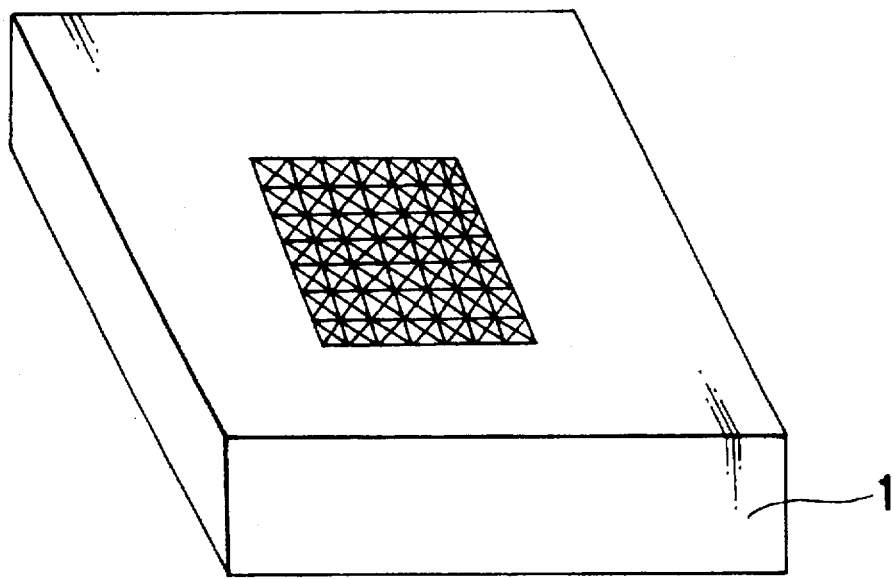
FIGS. 4 and 5 are used to describe solar battery cells according to alternative embodiments of the first embodiment of the present invention.
Figure 5:
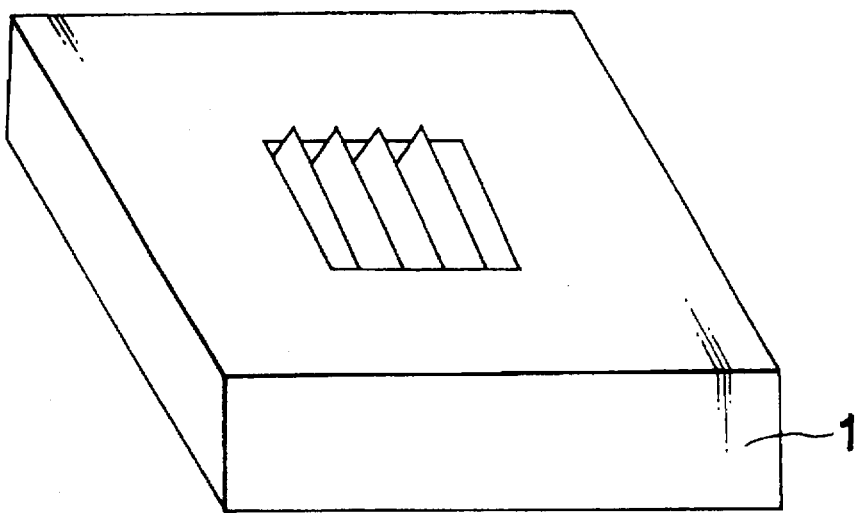

While the first embodiment has been described above assuming the use of quadrangular pyramids for the projection group (rough surface structure), it is also possible to obtain the same effect using quadrangular pyramidal indentations as shown in FIG. 4, or a series of linear V-shaped channels as shown in FIG. 5.

The quadrangular pyramidal indentations as shown in FIG. 4 can be formed by using the following process.

First, a mask patterned with quadrangles corresponding to the size of the base of the inverted quadrangular pyramids forming the indentations is placed over the semiconductor material constituting the power generation layer. The mask used in this example has a grid-shaped pattern of quadrangles measuring 20 μm per side with the quadrangles spaced at a 2-3 μm pitch. The semiconductor material is then immersed in an alkaline solution of, for example, potassium hydroxide or sodium hydroxide, and wet etching is used to form the surface pattern.

Using this mask and method, a dense pattern of adjacent quadrangular pyramidal indentations was formed in a semiconductor layer comprising a (100) single crystal silicon.

The series of linear V-shaped channels as shown in FIG. 5 can be formed using a mask with a striped pattern but otherwise similar to that used to form the inverted quadrangular pyramids above. Said mask is placed over the semiconductor material, and the semiconductor material is then wet-etched as above. The semiconductor material in this case is again a semiconductor layer comprising a (100) single crystal silicon, or a polycrystalline silicon with the crystal faces oriented to (100).

Embodiment 2

Figure 6:
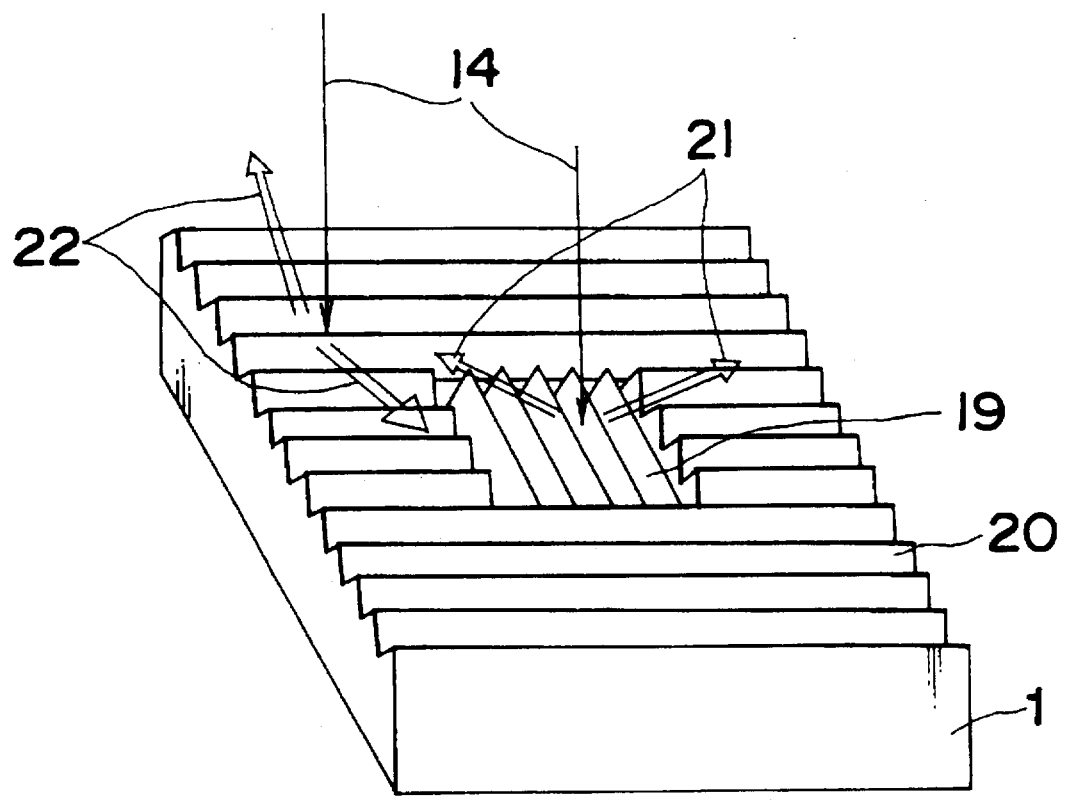
FIG. 6 is used to describe a solar battery cell to the second embodiment of the present invention.

An alternative embodiment of the present invention is described with reference to FIG. 6 below. As shown in FIG. 6, the surface of this solar battery 1 comprises a series of linear V-shaped channels 19 shown formed in the vertical direction in FIG. 6, and another series of (horizontal) linear V-shaped channels 20 formed in the direction perpendicular to that of the other (vertical) V-shaped channels 19. When incident light 14 is irradiated perpendicularly to this solar battery surface, the reflected light 21 from the surface of the vertical V-shaped channels 19 is reflected in a direction different from that of the light 22 reflected from the surface of the horizontal V-shaped channels 20.

Note that again the antireflection film applied to the solar battery surface has been omitted in this embodiment.

Figure 7A:
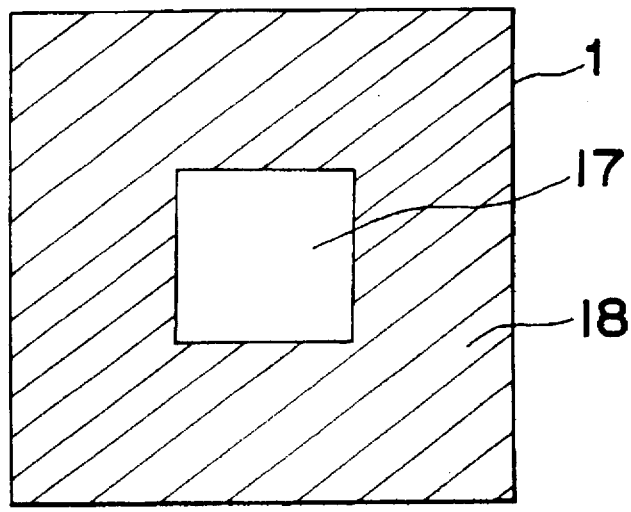
FIGS. 7A and 7B illustrate the patterns of reflected light from a solar battery cell according to the second embodiment of the present invention.
Figure 7B:
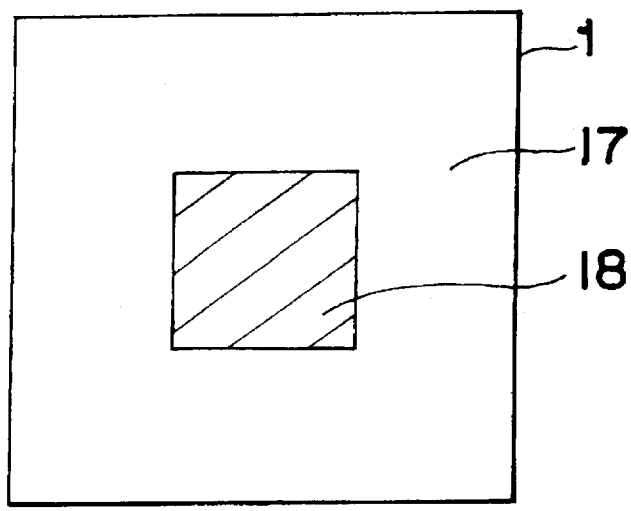

FIGS. 7A and 7B shows the different patterns that may be recognized when the solar battery in FIG. 6 is observed from two typical directions. As will be seen from these figures, the surface pattern is divided into two distinct regions: bright surface area 17 resulting from strong reflected light, and dark surface area 18 from which no light appears to reflect at the observation position. These bright and dark surface areas may change according to the observer position: FIG. 7A represents the pattern observed when the solar battery 1 is viewed from the direction of reflected light 21 in FIG. 6, producing a solid square reflection; FIG. 7B represents the pattern observed when the solar battery 1 is viewed from the direction of reflected light 22 in FIG. 6, producing a frame-like pattern with a square hole in the center.

Note that because the channel shape is not changed, the surface reflection suppression effect of the channelled structure is maintained. By thus combining these structures, various patterns can be formed on the surface of the solar battery using directional reflected light. As a result, the photoelectric conversion efficiency is maintained, and a solar battery with visual added-value can be obtained.

It is to be noted that the relative angle between the vertical V-shaped channels 19 and horizontal V-shaped channels 20 is described as 90° above, but the present invention shall not be limited to 90° and may be any angle between 0° and 180°, specifically excluding 0° and 180°, although the effect will vary according to this relative angle.

Figure 8:
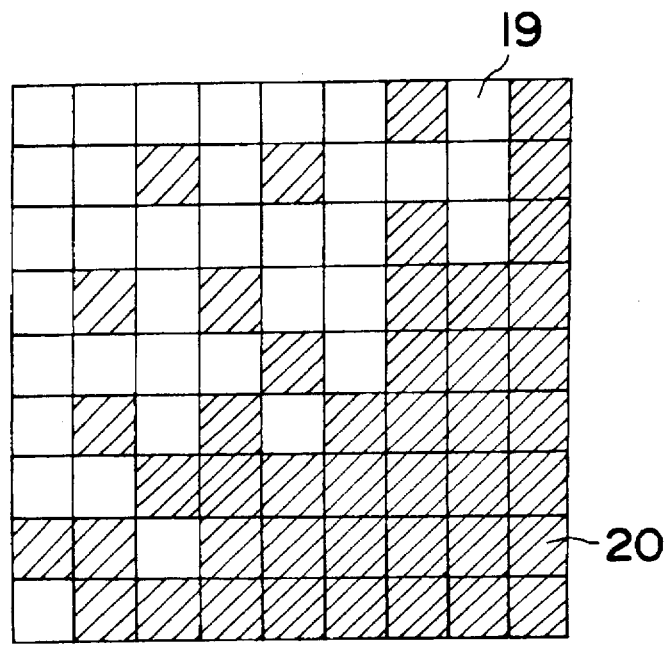
FIG. 8 is used to describe a solar battery cell according to an alternative embodiment of the second embodiment of the present invention.

It should also be noted that the contrast between the reflected light is strong in the above embodiment with reflected light being either bright or dark. By changing the orientation of the V-channels in units of a smaller scale as shown in FIG. 8, however, the contrast ratio can be controlled to achieve a macroscopically pale reflection, and patterns with subtle shading can be achieved. With the pattern shown in FIG. 8, a pattern that becomes gradually brighter from the bottom right to the upper left corner when viewed from the direction of reflected light 21 can be achieved by providing a relatively large number of horizontal V-shaped channels 20 in the lower right area.

Note, further, that the V-shaped channels of this embodiment may be replaced by quadrangular pyramidal projections or indentations as described above.

In addition, the V-shaped channels, quadrangular pyramidal projections, or quadrangular pyramidal indentations of this embodiment can be formed using the methods described in the first embodiment above.

Embodiment 3

Figure 9:
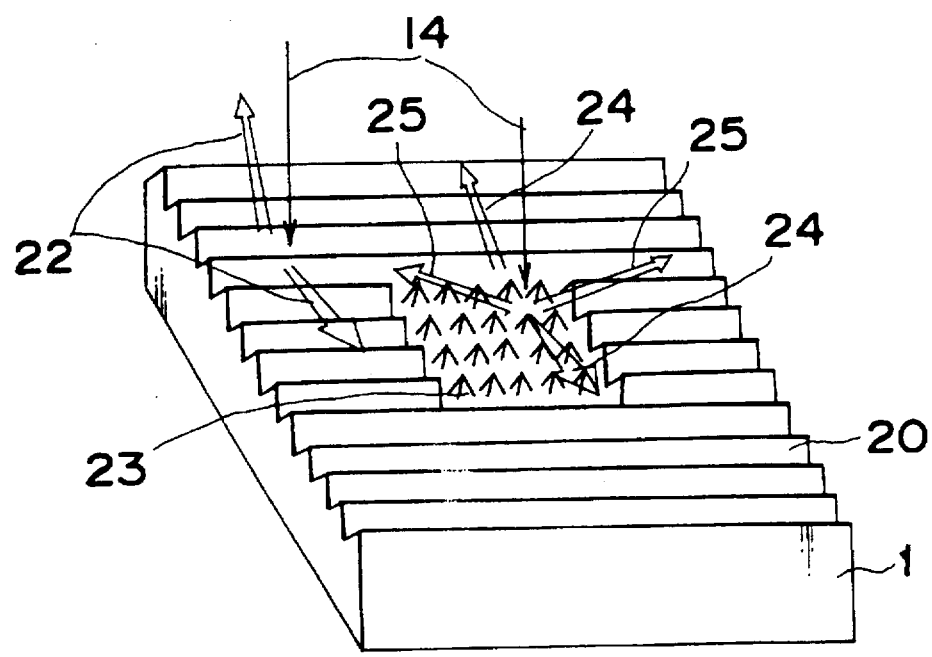
FIG. 9 is used to describe a solar battery cell according to the third embodiment of the present invention.

A further alternative embodiment of a solar battery cell according to the present invention is described next with reference to FIG. 9. As shown in FIG. 9, this embodiment comprises in the surface of the solar battery thereof a combination of differently shaped rough areas. Specifically, a rough textured area 13 of quadrangular pyramidal projections as shown in FIG. 2 of the first embodiment is formed inside the area of horizontal V-shaped channels 20 shown in FIG. 6 of the second embodiment above, replacing the vertical V-shaped channels 19 also shown in FIG. 6.

Note that again the antireflection film applied to the solar battery surface has been omitted in this embodiment.

Figure 10A:
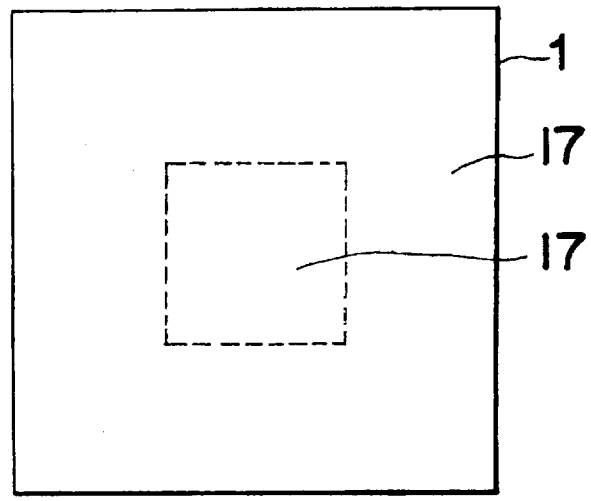
FIGS. 10A and 10B illustrate the patterns of reflected light from a solar battery cell according to the third embodiment of the present invention.

The textured area 23 (corresponding to the textured area 13 in FIG. 6) is formed from quadrangular pyramids such that part of the reflected light 24 resulting from perpendicular incident light 14 is reflected in substantially the same direction as the reflected light 22 from the linear V-shaped channels 20. FIG. 10 shows the different patterns that may be recognized when the solar battery in FIG. 9 is observed from two typical directions.

When incident light 14 is irradiated to a solar battery 1 comprising on the surface thereof a series of linear V-shaped channels 20 and a group 23 of quadrangular pyramidal projections where one pair of sides of the quadrangular pyramidal projections is facing the same direction as the reflecting faces of the V-shaped channels 20, the reflected light from the quadrangular pyramidal rough textured area 23 is separated into light 24 reflected in the same direction as the reflected light 22 from the V-shaped channels 20, and light 25 reflected in a direction different from that of light 22 reflected from the V-shaped channels 20. As a result, when the solar battery 1 is viewed from the direction of reflected light 22 and 24, the solar battery will be seen as uniformly reflecting from the entire surface thereof as shown in FIG.

Figure 10B:
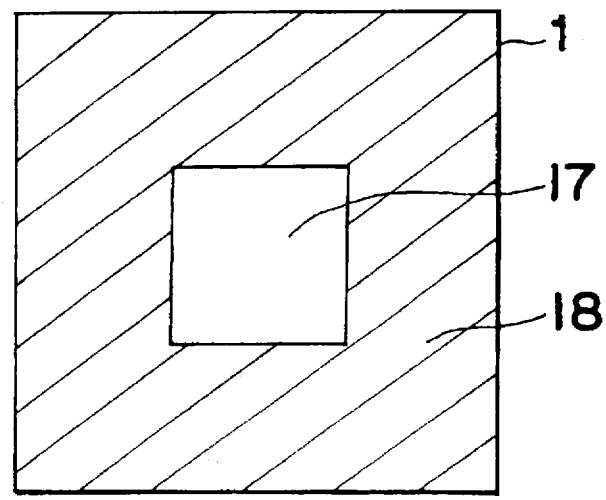

10A. When viewed from the direction of reflected light 25, a square reflecting pattern as shown in FIG. 10B will be seen.

It is therefore possible to create surface patterns using directional reflected light as in the first embodiment above without distribution of the surface reflection suppression effect in the solar battery surface, and a solar battery with visible added-value can be obtained.

It is to be noted that the orientation of the side faces of the V-shaped channels 20 must not necessarily match the orientation of one pair of faces in the rough texture area 23. More specifically, the number of directions from which the surface pattern of the solar battery 1 can be recognized can be between two and six directions, inclusive, by controlling the orientation of these faces.

Note, further, that the same effects can be obtained when the quadrangular pyramidal rough textured area 23 described above is alternatively a group of quadrangular pyramidal indentations, or when the surface pattern is a different combination of V-shaped channels and a surface pattern that is not a V-shaped channel.

Embodiment 5

A solar battery module according to another embodiment of the present invention is described below with reference to FIG. 11.

Figure 11:
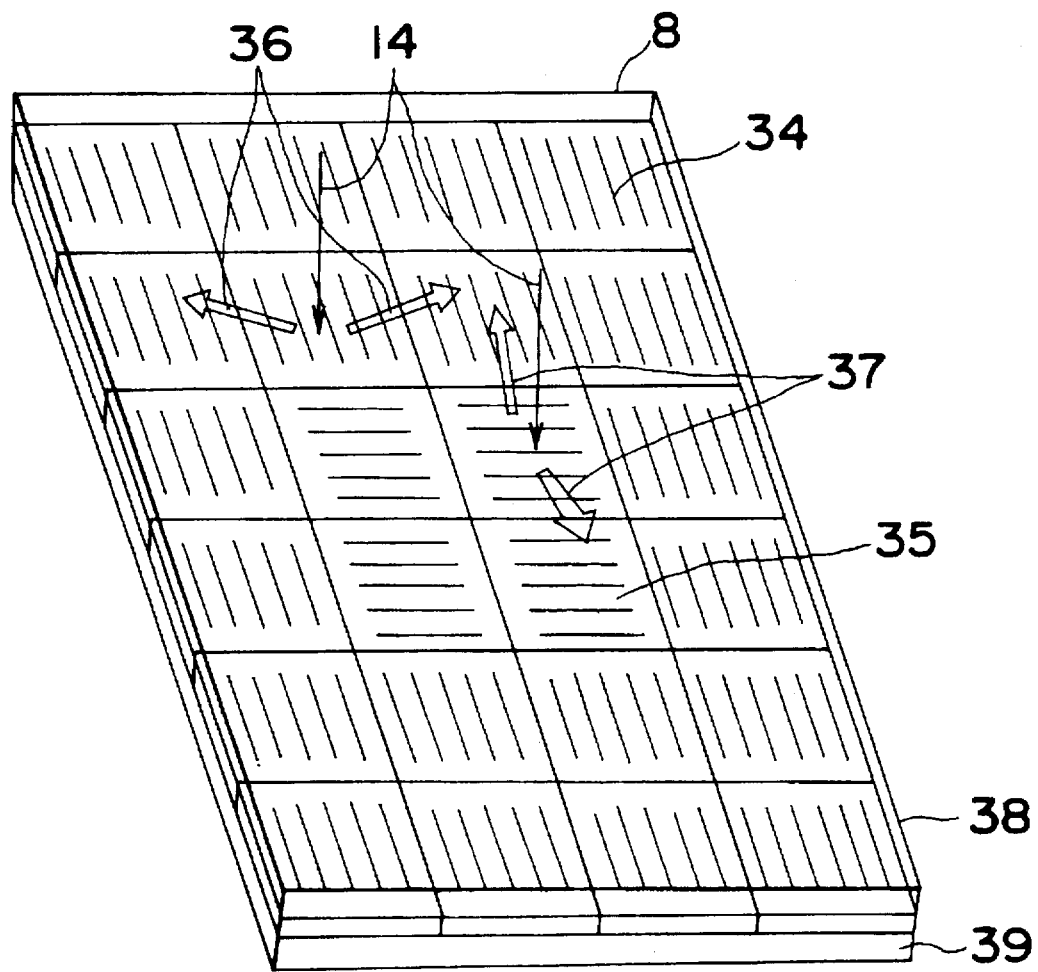
FIG. 11 is used to describe a solar battery module according to the fifth embodiment of the present invention.

As shown in FIG. 11, the solar battery module 8 comprises an array of solar battery cells arranged four cells wide and six cells long on a resin substrate 39. The top surface of the solar battery cells is then covered with a glass panel 38. The solar battery cells constituting this solar battery module 8 are of two types: solar battery cells 34 with the V-shaped surface channels arranged vertically (parallel to the long side of the solar battery module 8), and solar battery cells 35 with the V-shaped surface channels arranged horizontally (perpendicular to the direction of the vertical solar battery cells 34).

When incident light 14 strikes the surface of this solar battery module 8, the light 36 reflected from the vertically oriented solar battery cells 34 and the light 37 reflected from the horizontally oriented solar battery cells 35 form perpendicular angles within the surface of the module.

FIG. 12 shows the different patterns that may be recognized when the solar battery in FIG. 11 is observed from two typical directions.

Figure 12A:
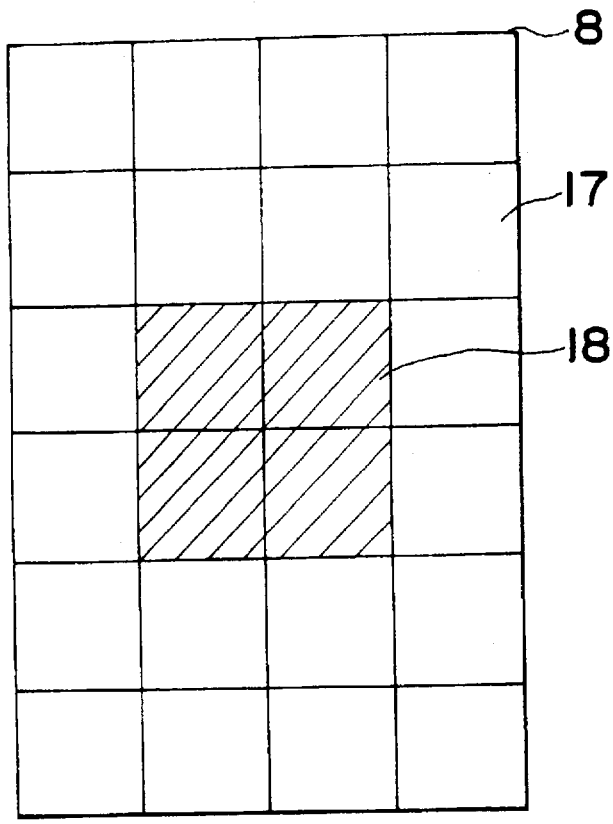
FIGS. 12A and 12B illustrate the patterns of reflected light from a solar battery module according to the fifth embodiment of the present invention.
Figure 12B:
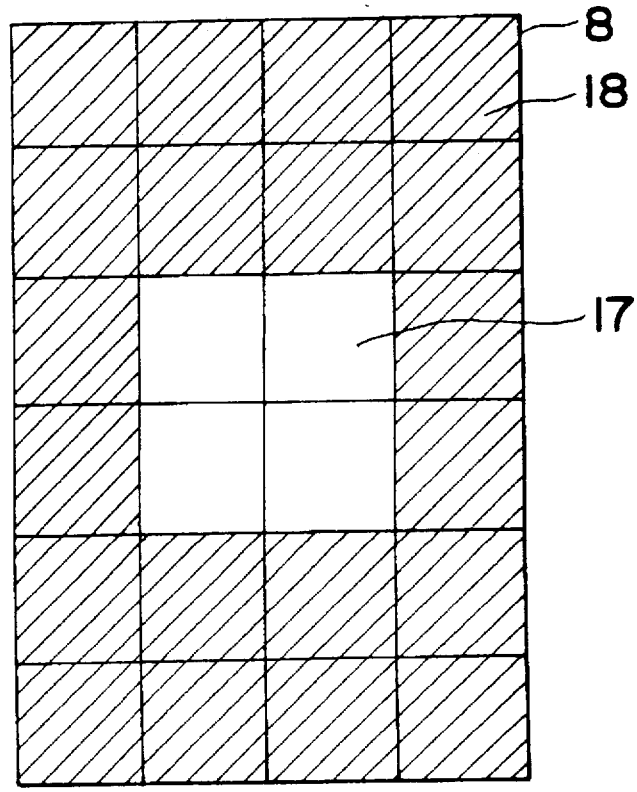
Figure 13A:
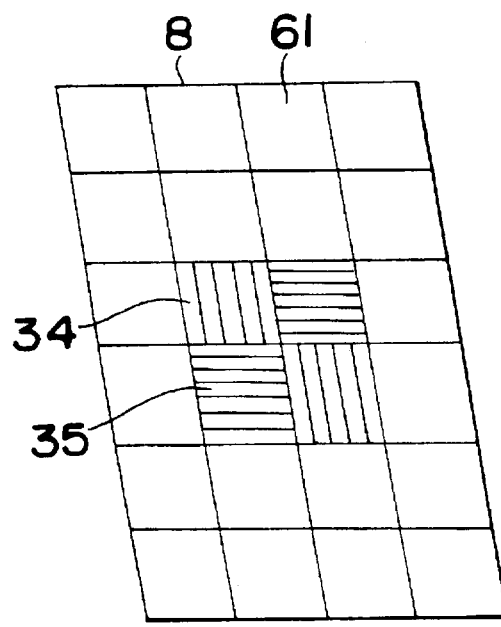
FIGS. 13A, 13B, 13C, and 13D are used to describe a solar battery module according to an alternative embodiment of the fifth embodiment of the present invention.
Figure 13B:
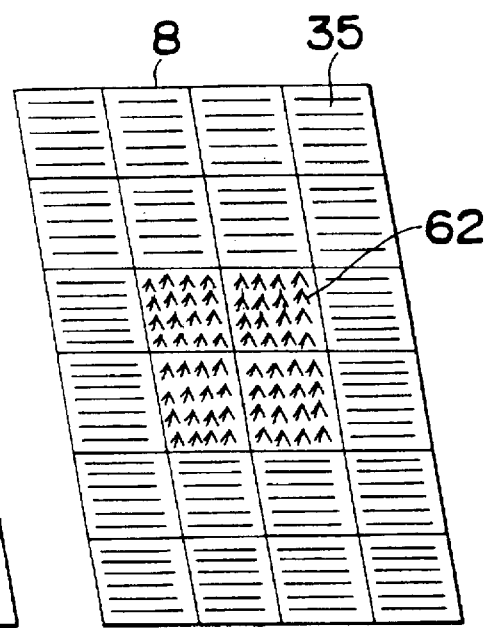
Figure 13C:
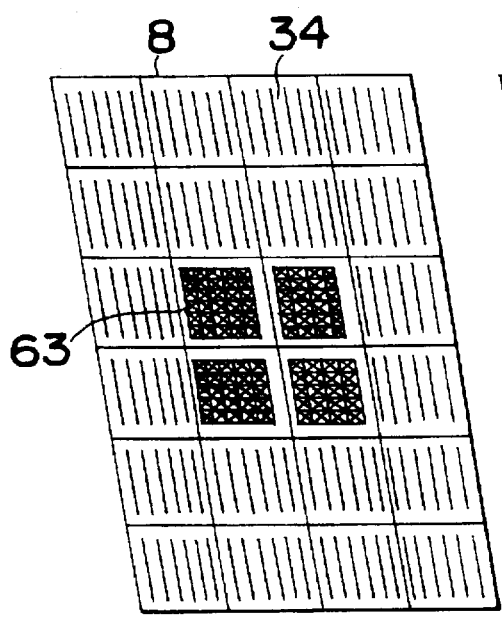
Figure 13D:
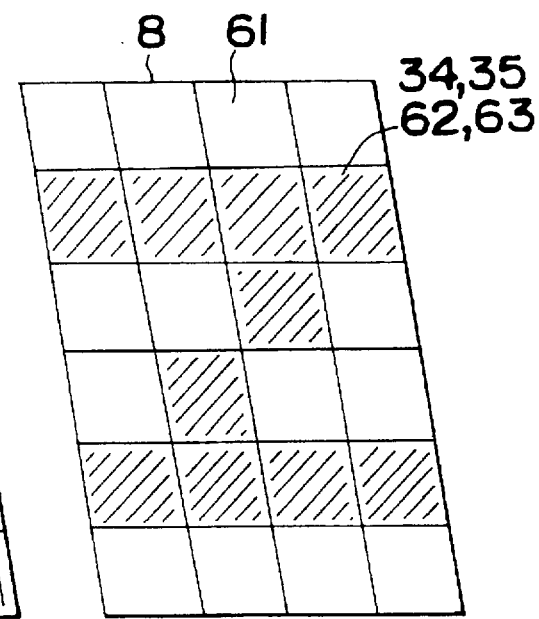

When incident light 14 strikes the surface of a solar battery module 8 comprising solar battery cells 34 and 35 of which the V-shaped channels are oriented in mutually perpendicular directions (horizontally and vertically in this example shown in FIG. 11), the light 36 reflected from the vertically oriented solar battery cells 34 and the light 37 reflected from the horizontally oriented solar battery cells 35 reflect in different directions (form perpendicular angles within the surface of the module). As a result, when the solar battery module 8 is observed from the direction of reflected light 36, a frame-like pattern with a square hole in the center as shown in FIG. 12A is seen; when the solar battery module 8 is observed from the direction of reflected light 37, a quadrangular reflection pattern as shown in FIG. 12B is seen.

Thus, by controlling the arrangement of the solar battery cells comprising a rough surface pattern suppressing surface reflections, it is possible to form recognizable patterns on the surface of the solar battery module using directional reflected light, and a solar battery module with visual added-value can be achieved.

It is to be noted that the surface pattern of each individual solar battery cell is uniform throughout that cell (individual cells do not produce a pattern as described in the first through fourth embodiments above) in the above embodiment. The pattern displayed by the solar battery module is achieved by appropriately arraying solar battery cells of different surface patterns.

It will also be obvious that while the above embodiment is achieved by appropriately arranging the orientation of the V-shaped channels on the surfaces of the individual solar battery cells, the various effects of the solar battery cells described in the first through fourth embodiments above can also be applied to the solar battery module by using various combinations of flat and rough surface areas, V-shaped channels and quadrangular pyramid projection or indentation groups, and angles in the reflecting surfaces of the rough areas. An example of this type of solar battery module is shown in FIGS. 13A–13D As shown in FIGS. 13A–13D various solar battery modules 8 are achieved by combining in various ways solar battery cells 34 with the V-shaped channels oriented vertically, solar battery cells 35 with the V-shaped channels oriented horizontally, solar battery cells 61 with a smooth surface, solar battery cells 62 with a quadrangular pyramid projection group on the surface, and/or solar battery cells 63 with a quadrangular pyramid indentation group on the surface.

Note that the solar battery module according to the fifth embodiment above is assembled from two or more types of solar battery cells where the surface pattern of each cell is uniform throughout that cell, and the pattern displayed by the solar battery module is formed by appropriately arranging these solar battery cells of different surface patterns. This concept can be further applied on a larger scale to form solar battery module groups wherein all solar battery cells in each complete solar battery module used in the solar battery module group have the same surface pattern. The component solar battery modules therefore also have a uniform surface pattern, and the pattern of the solar battery module group is achieved by combining solar battery modules of different surface patterns (which are achieved by using solar battery cells of different surface patterns in each module). An example of this solar battery module group is shown in FIG. 14.

Figure 14:
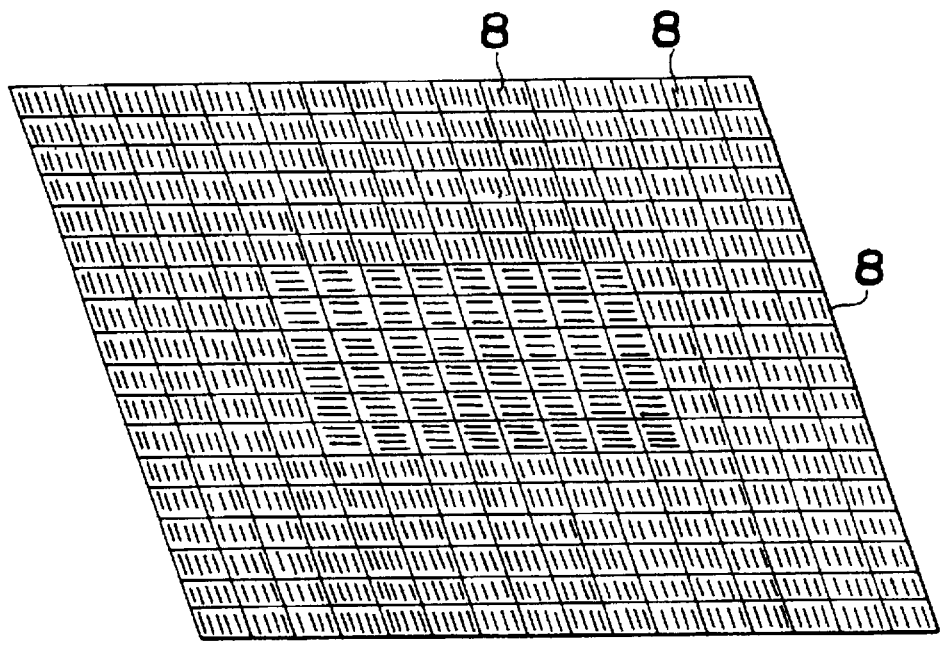
FIG. 14 is used to describe a solar battery module according to another alternative embodiment of the fifth embodiment of the present invention.
Figure 15:
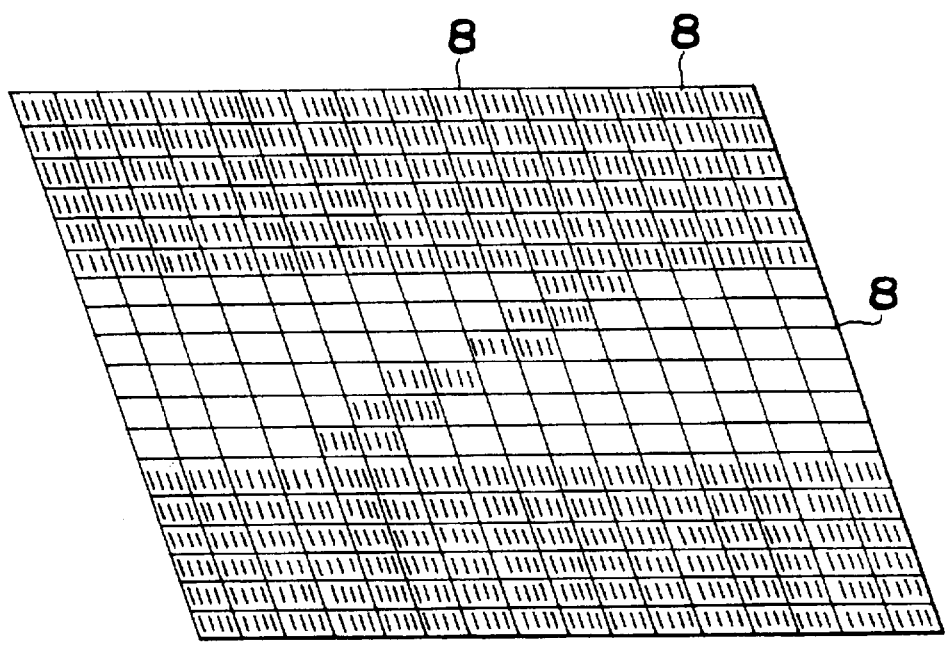
FIG. 15 is used to describe a solar battery module according to a further alternative embodiment of the fifth embodiment of the present invention.

Referring to FIG. 14, the solar battery module group comprises a solar battery module array comprising four modules horizontally and three modules vertically. Two types of solar battery modules are used: modules comprising solar battery cells 34 with vertically oriented V-shaped channels, and solar battery cells 35 with horizontally oriented V-shaped channels. As shown in FIG. 15, it is also possible to combine solar battery modules wherein all solar battery cells 34 have vertically oriented V-shaped channels, and modules wherein some of the solar battery cells are solar battery cells 34 with vertically oriented V-shaped channels. Other solar battery module groups can also be formed using other combinations of solar battery modules comprising various combinations of solar battery cells according to the first through fourth embodiments of the present invention.

Embodiment 6

A solar battery module according to another embodiment of the present invention is described below with reference to FIG. 16.

Figure 16:
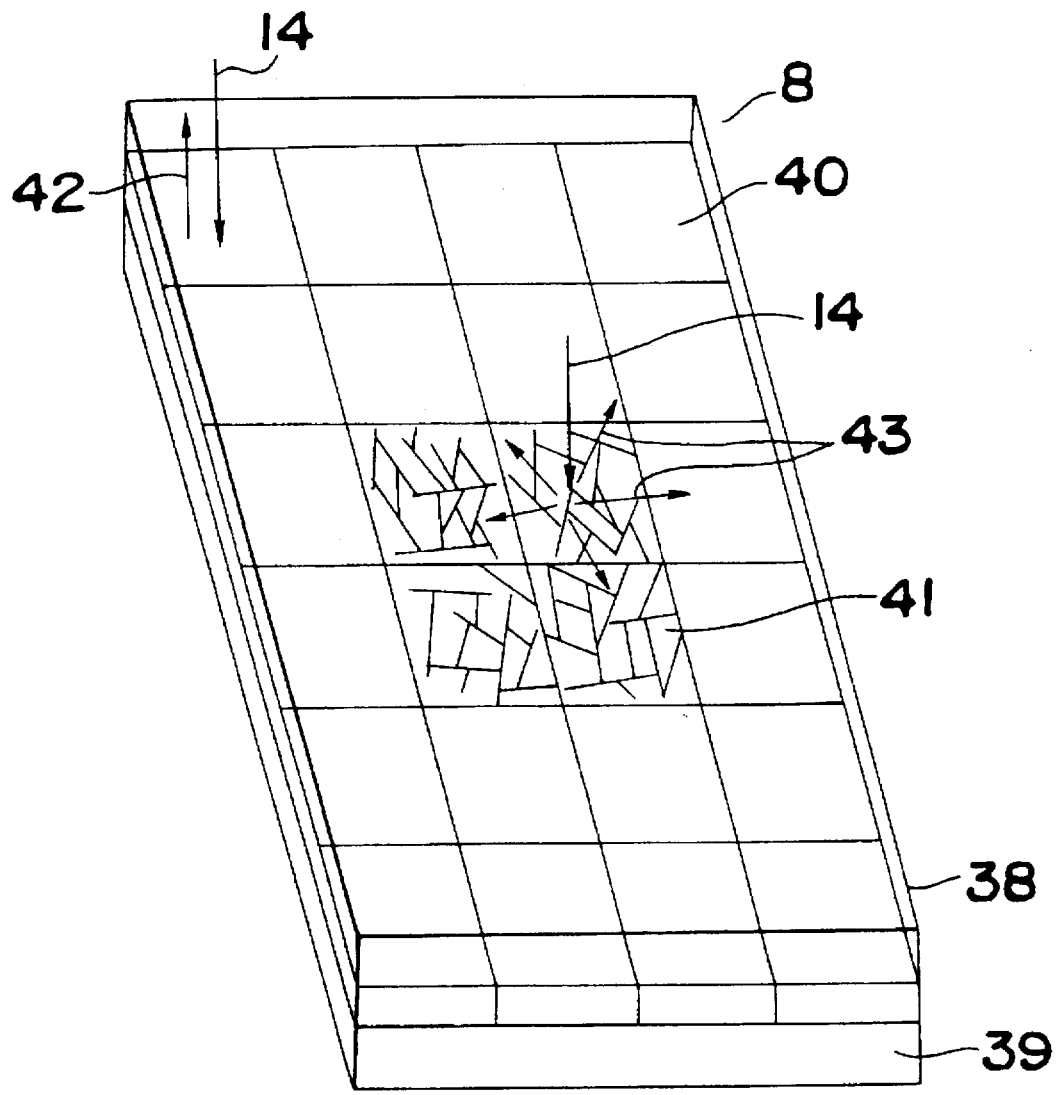
FIG. 16 is used to describe a solar battery module according to a sixth embodiment of the present invention.

As shown in FIG. 16, the solar battery module 8 comprises an array of solar battery cells arranged four cells wide and six cells long on a resin substrate 39 with the top surface of the solar battery cells covered by a glass panel 38.

The solar battery cells constituting this solar battery module 8 are of two types: solar battery cells 40 wherein the surface of the power generation layer semiconductor is a single crystal material, and solar battery cells 41 wherein the surface of the power generation layer semiconductor is a polycrystalline material. The reflected light 42 from the solar battery 40 of which the surface of the power generation layer semiconductor is a single crystal material reflects in a substantially constant direction, but the reflected light 43 from the solar battery 41 of which the surface of the power generation layer semiconductor is a polycrystalline material is scattered light reflecting in plural directions.

Figure 17:
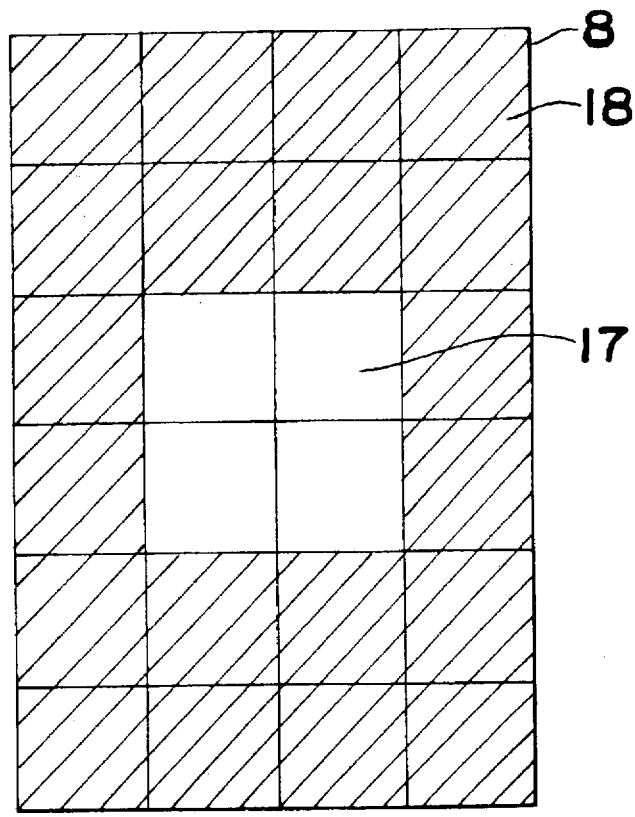
FIG. 17 illustrates the pattern of reflected light from a solar battery module according to the sixth embodiment of the present invention.

FIG. 17 shows the pattern that may be recognized when the solar battery in FIG. 16 is seen from the typical (intended) viewing direction.

As shown in FIG. 16, when incident light 14 strikes the solar battery module comprising single crystal solar battery cells 40 and Polycrystalline solar battery cells 41, the reflected light 43 from the polycrystalline solar battery surface becomes non-directional scattered light because the crystal faces of the polycrystalline material are oriented in various directions, but the light 42 reflected from the surfaces of the single crystal solar battery cells 40 is uniform directional light. As a result, a frame-like pattern with a square hole in the center as shown in FIG. 17 is seen when the solar battery module is observed from the direction of reflected light 42, but no reflection pattern is seen when viewed from any other direction.

Thus, by controlling the arrangement of single crystal and polycrystalline solar battery cells, it is possible to form recognizable patterns on the surface of the solar battery module using reflected light, and a solar battery module with visible added-value can be achieved.

While the above embodiment has been described with reference to the surface pattern of the solar battery cells, the same effects can be obtained in solar battery modules and solar battery module groups formed from polycrystalline solar battery cells and solar battery cells or solar battery modules according to any of the first through fifth embodiments above. Various combinations with single crystal solar battery cells can also be used.

It is to be noted that while the semiconductor material in the preceding embodiments has been described as a silicon material, it will be obvious that the present invention shall not be limited to silicon semiconductor materials, and any semiconductor material usable for the power generation layer of a solar battery may be used, including GaAs, CdTe, and CuInCe$_2$.

Embodiment 7

While the sixth embodiment above has been described using a combination of single crystal and polycrystalline materials, various display patterns can also be achieved using only single crystal solar battery cells by modifying the method of placing the meths. This method is described as the seventh embodiment of the invention with reference to FIG. 18 below.

Figure 18:
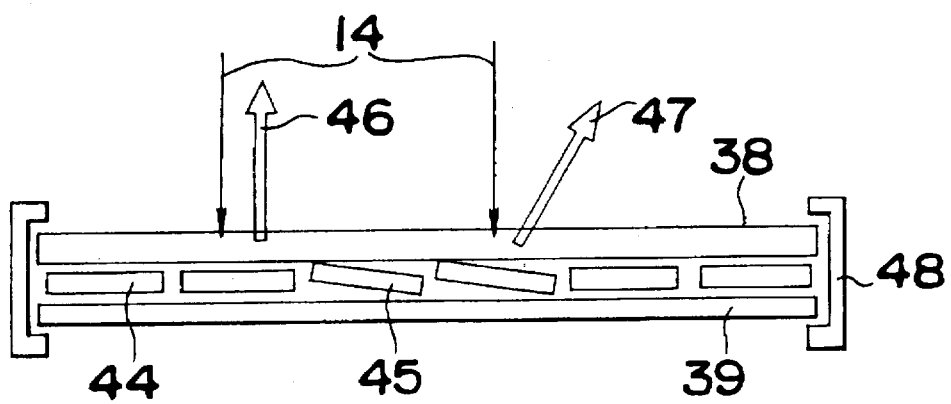
FIG. 18 is used to describe a solar battery module according to a seventh embodiment of the present invention.

FIG. 18 is a cross section of the solar batteries assembled into a single solar battery module. As shown in the figure, there are both solar battery cells 44 arrayed parallel to the glass surface panel, and solar battery cells 45 arrayed at an angle to the glass panel. The module is then secured by a module frame 48. It will be obvious that the light 46 reflected from the solar battery cells 44 parallel to the glass surface panel, and the light 47 reflected from the solar battery cells 45 at an angle to the glass panel, reflect in different directions. The reflected light seen by the observer will therefore differ according to the angle of observation. As a result, different patterns can be observed depending upon the viewing angle by changing the angle of the solar battery cells within the module to form the display pattern.

It should be further noted that the solar battery cells used in the present embodiment may be solar battery cells according to any of the first through sixth embodiments above.

Embodiment 8

Figure 19A:
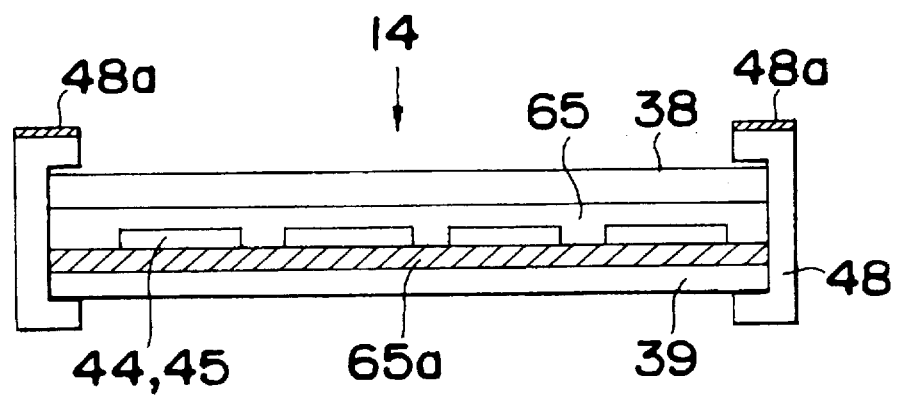
FIGS. 19A and 19B are used to describe a solar battery module according to an eighth embodiment of the present invention.
Figure 19B:
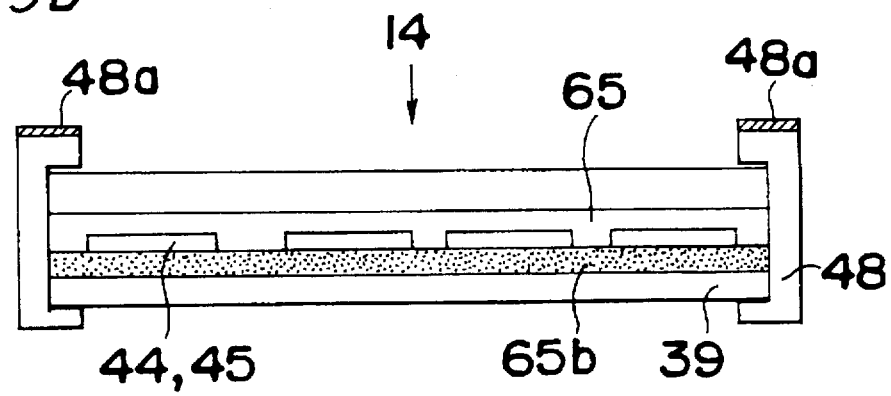

While various patterns can be formed by changing the angle of the solar battery cells within the solar battery module as described in the preceding embodiment, it is also possible to create various patterns by placing a colored resin in areas not contributing to photoelectric conversion by the solar battery cell as shown in FIGS. 19A and 19B. Examples of such non-contributing areas include the resin member between the cells, the module frame areas 48a exposed to the incident light, and the back 65a of the solar battery cell sealing resin 65. It is also possible to use a colored frame material or member such as colored aluminum for the module frame 48. In addition, while resin is placed in the module at two different times during the production process (to the exposed side and to the back), it is only necessary to color or use colored resin for the resin in the cell backing.

Note, also, that the same effect can be obtained by using an additive causing light scattering in the resin 65b in the cell backing. This additive may be, for example, ceramic powder or confetti-like colored particles.

Embodiment 10

An alternative embodiment of the solar battery cells according to the present invention is described below with reference to FIGS. 20A and 20B.

Figure 24A:
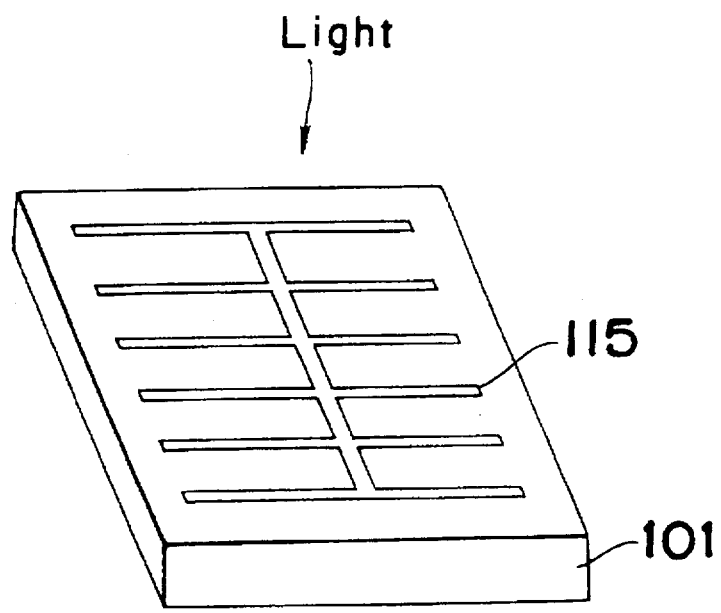
FIGS. 24A and 24B are used to describe the structure of a conventional semiconductor solar battery.
Figure 24B:
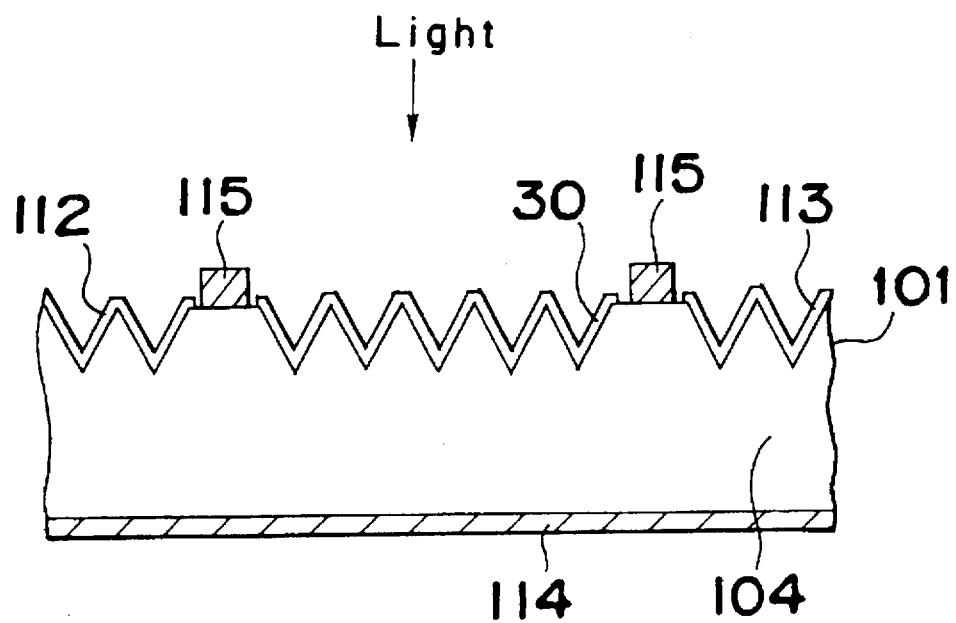
Figure 25:
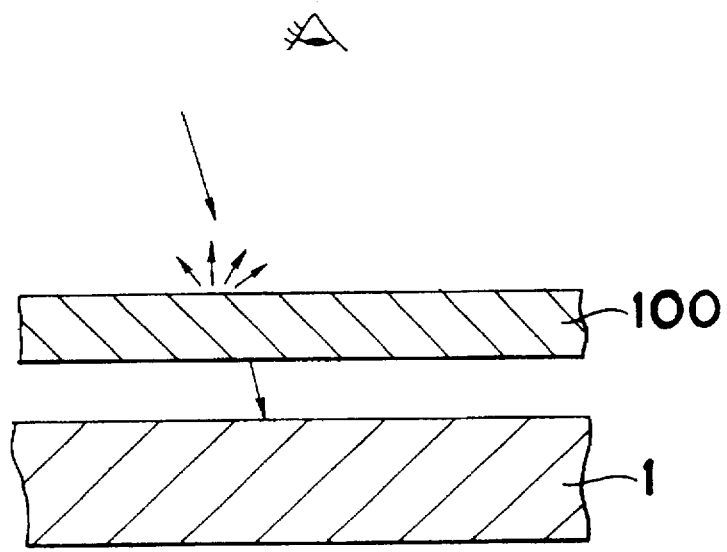
FIG. 25 is used to describe the structure of another conventional semiconductor solar battery.
Figure 26:
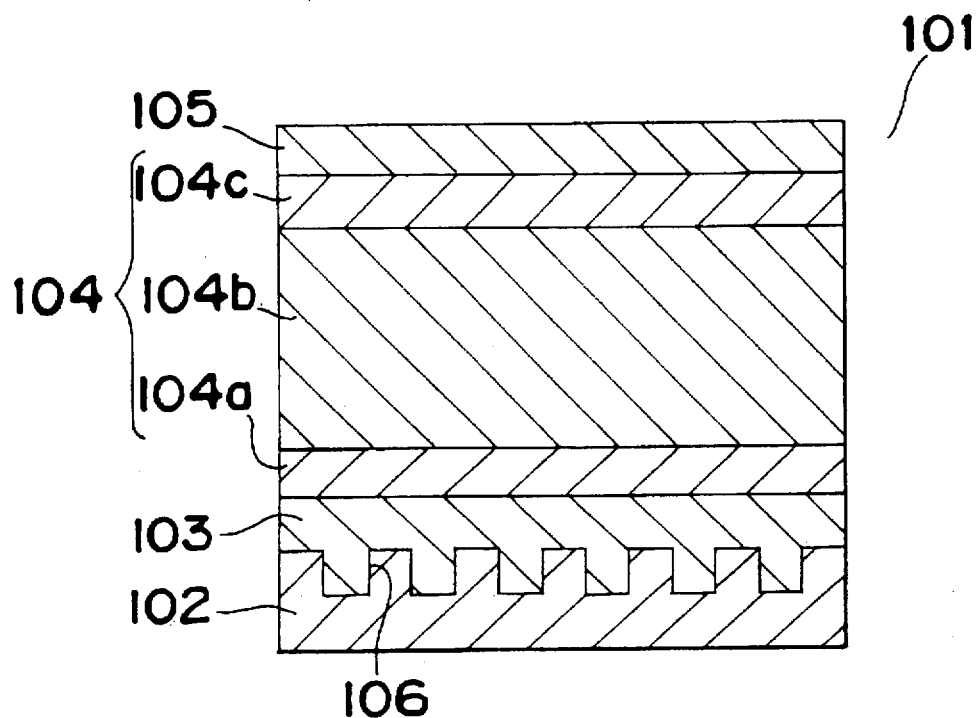
FIG. 26 is used to describe the structure of a further conventional semiconductor solar battery.
Figure 27:
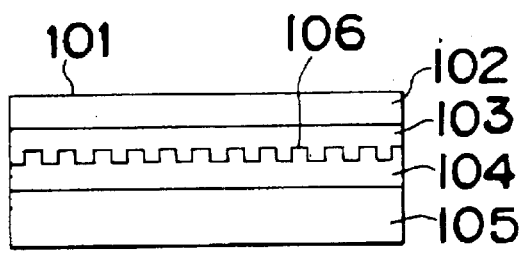
FIG. 27 is used to describe the structure of a still further conventional semiconductor solar battery.
Figure 28:
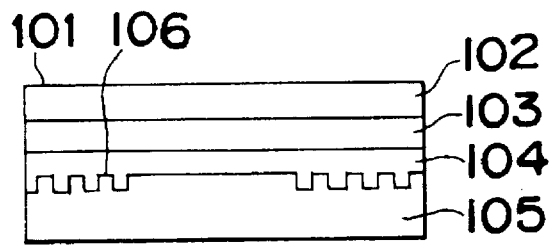
FIG. 28 is used to describe the structure of another conventional semiconductor solar battery.
Figure 29:
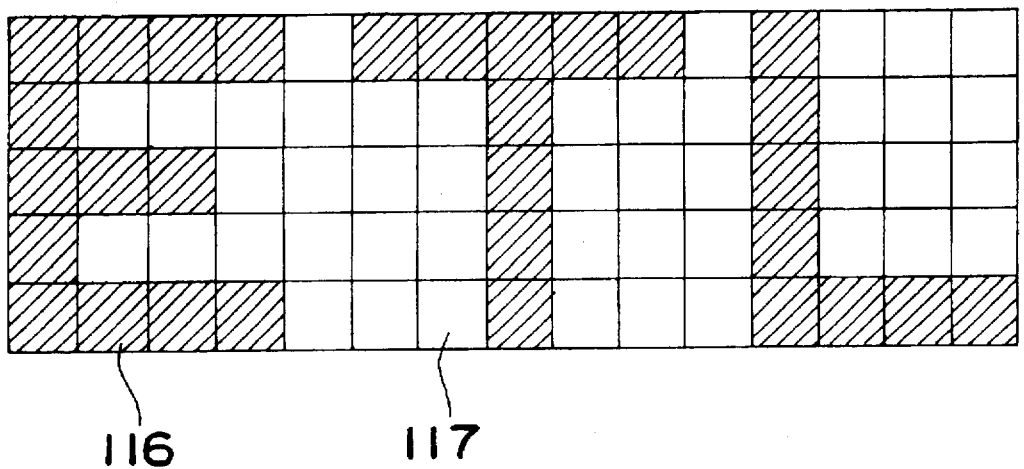
FIG. 29 is used to describe the arrangement and use of conventional solar batteries of differing colors or shades.

The surface of solar batteries according to the prior art comprises n-electrodes 52 and solar battery surface areas where there are no electrodes as shown in FIG. 24. The area forming the display pattern using reflections of the incident light is the surface area where there are no electrodes, and light reflected from the surface of the n-electrodes 52 therefore differs slightly from the desired pattern.

This problem is solved by forming the electrodes on one side of the power generation layer (the side opposite the incidence side). As shown in FIG. 20A, an n-type semiconductor layer 50 is formed on the surface of the p-type semiconductor substrate 49, and an antireflection film 30 is formed over the n-type semiconductor layer 50. Through-holes 54 are also formed in the p-type semiconductor substrate 49. n-type electrodes 52 for the n-type semiconductor layer 50 are then formed near the through-holes 54 in the back of the p-type semiconductor substrate 49, and p-type electrodes 51 are formed in the p-type semiconductor layer in the back of the p-type semiconductor substrate 49.

Figure 20A:
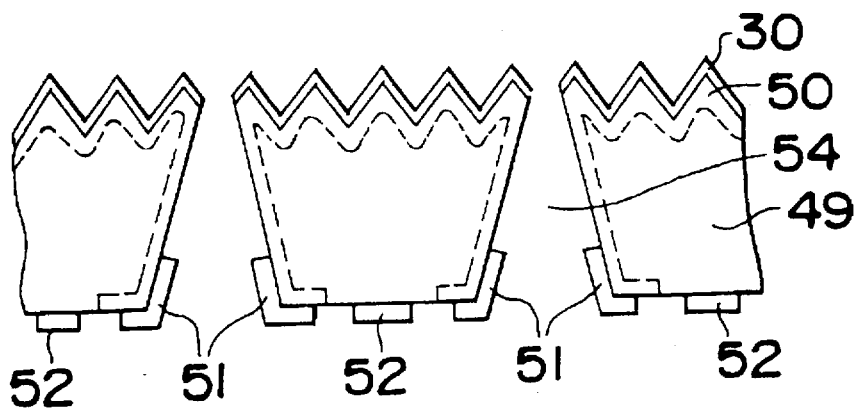
FIGS. 20A and 20B are used to describe a solar battery cell according to the tenth embodiment of the present invention.

As shown in FIG. 20A, when through-holes 54 are formed in the solar battery, and both p-type electrodes 51 and n-type electrodes 52 are provided on the back of the solar battery, the surface of the solar battery is free of electrodes and can be used to form sharp patterns of any design unaffected by interference from surface electrodes. As a result, the effects achieved by the first through eighth embodiments above can be achieved.

Figure 20B:
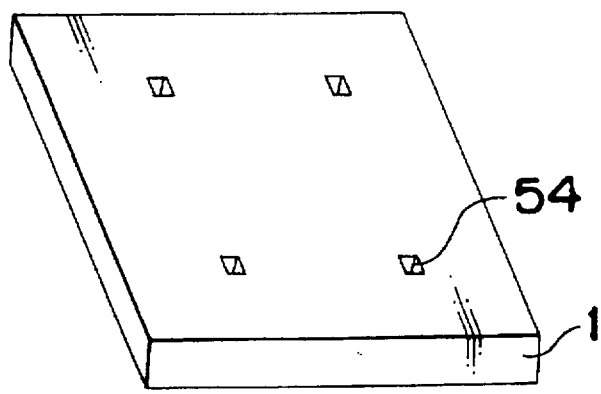

Furthermore, as shown in FIG. 20B, the throughholes are only tiny holes in the surface, thus improving both the photoelectric conversion efficiency and visual effects of the solar battery cell compared with cells having surface electrodes.

Figure 21:
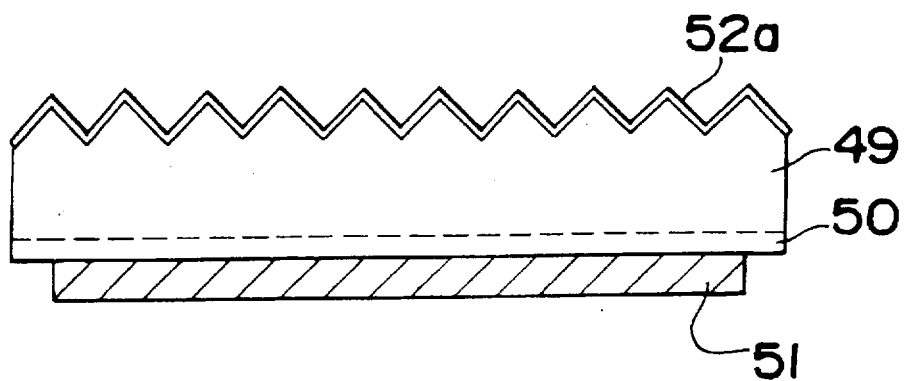
FIG. 21 is used to describe a solar battery cell according to an alternative embodiment of the tenth embodiment of the present invention.

It should be further noted that while gold or other metallic electrodes with high surface reflectance are used in the preferred embodiments above, transparent electrodes of ITO or another material may be used on the front or back surfaces of the solar battery cells. An example of a transparent electrode 52a provided on the solar battery surface is shown in FIG. 21.

Embodiment 11

A further embodiment of the present invention is described next.

Figure 22:
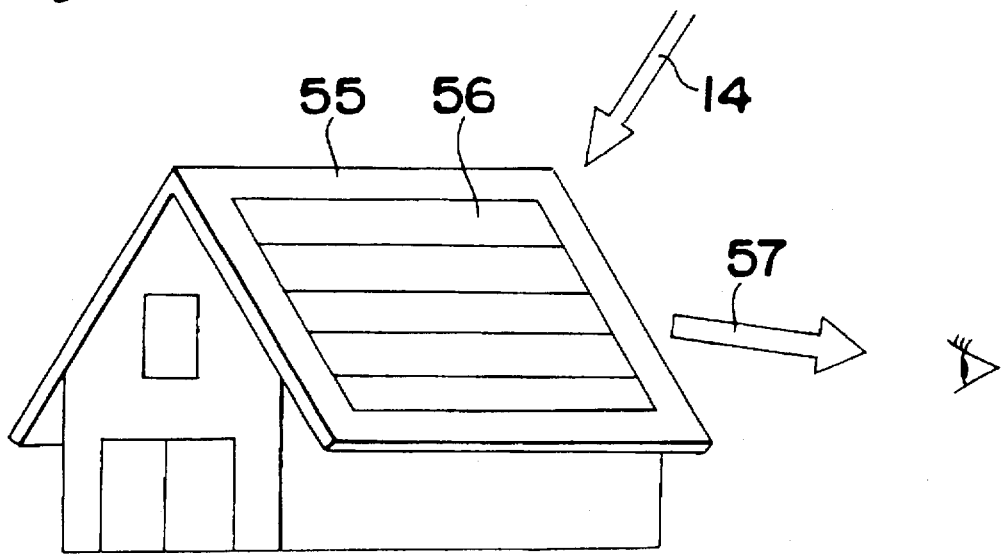
FIG. 22 is an illustration of one potential outdoor application for solar battery cells, solar battery modules, and solar battery module groups according to the first through tenth embodiments of the present invention.
Figure 23:
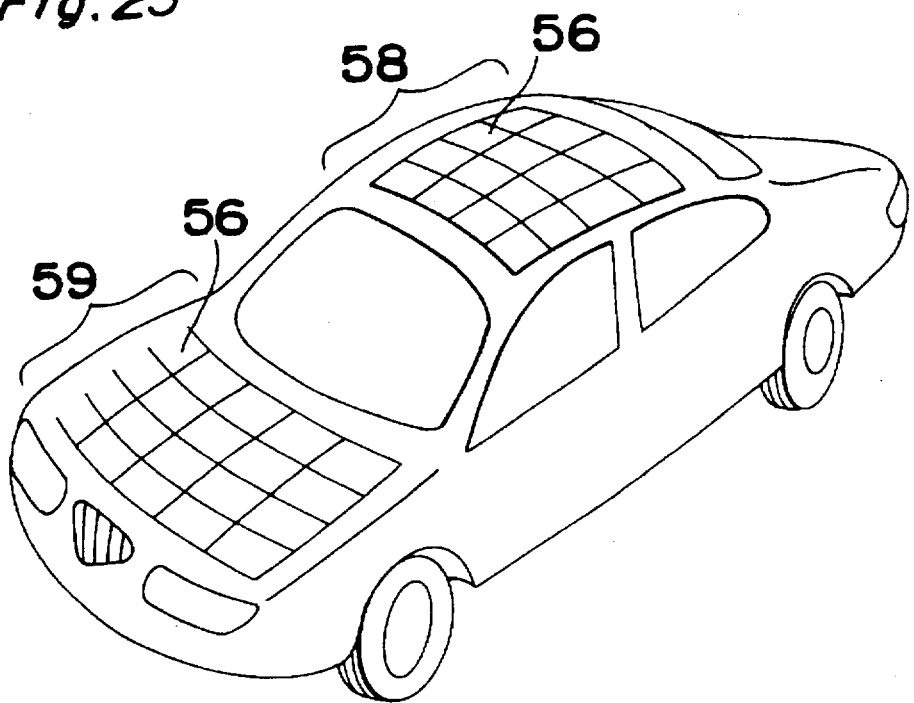
FIG. 23 is an illustration of another potential application for solar battery cells, solar battery modules, and solar battery module groups according to the first through tenth embodiments of the present invention when installed to a motor vehicle.

Potential applications for the solar battery cells, solar battery modules, and solar battery module groups described as the first through tenth embodiments of the invention above are shown in FIGS. 22 and 23. FIG. 22 shows a patterned solar battery module (or solar battery module group) 56 for displaying a specific pattern on the roof 55 of a building. FIG. 23 shows a patterned solar battery module (or solar battery module group) 56 for displaying a specific pattern on the roof 58 or front hood 59 of a motor vehicle.

As shown in FIG. 22, when a solar battery module 56 forming a display pattern according to the methods of the first through tenth embodiments above is installed on a roof 55 and exposed to incident light 14, the pattern formed on the solar battery module can be seen from a position above or below the roof by means of the reflected light 57. Specifically, by controlling the direction of reflection or the reflected wavelength by module unit or module group unit, the desired pattern can be recognized by the observers.

While no pattern is shown in FIG. 23, patterns can be similarly observed from the solar battery modules or solar battery module group provided on the roof 58 or hood 59 of the vehicle.

It must also be noted that the same effect can be obtained from solar batteries provided as the power supply for toys. The name of the solar battery manufacturer or device manufacturer, or other text or patterns, can thus be effectively displayed to attract attention, increase consumer awareness of a brand name, or contribute to innovative product development.

Because the patterns are also displayed using strong directional reflected light, patterns displayed in areas viewable from a motor vehicle will quickly stand out due to these strong reflections. Products with strong visual impact can thus be achieved, and the added-value of the product improved.

Furthermore, the reflecting direction can also be controlled by changing the angle of individual modules in a solar battery module group, and this property can be used to display text and other patterns.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A solar battery cell for displaying a desired pattern on a surface of a power generation layer, wherein a photoelectric current is generated from light incident upon the power generation layer, which comprises:

an electrode formed on the power generation layer for outputting the photoelectric current to an external load; and a means for changing the reflecting direction of incident light from at least one preselected surface area of the power generation layer surface on which the light is incident, to produce the desired pattern on the power generation layer surface observed from a selected direction.

2. A solar battery cell according to claim 1 wherein the means for changing the reflecting direction of the incident light of the at least one preselected surface area of the power generation layer is achieved by a change in the surface configuration of the power generation layer.

3. A solar battery cell for displaying a desired pattern, comprising:

a power generation layer for generating a photoelectric current from incident light, the surface of the power generation layer comprising smooth areas and rough areas arranged in a preselected pattern; and an electrode formed on the power generation layer for outputting the photoelectric current to an external load;

wherein said rough areas comprise groups of inclined flat reflecting surfaces for changing the reflection direction of incident light from at least one preselected surface area on the power generation layer surface on which the light is incident, to produce the desired pattern on the power generation layer surface observed from a selected direction.

4. A solar battery cell according to claim 3 wherein the rough areas comprise groups of quadrangular pyramidal projections.

5. A solar battery cell according to claim 3 wherein the rough areas comprise groups of quadrangular pyramidal indentations.

6. A solar battery cell according to claim 3 wherein the rough areas comprise V-shaped channels.

7. A solar battery cell according to claim 3 wherein the angle of the surfaces forming the rough areas is varied.

8. A solar battery cell according to claim 3 wherein the surface of the power generation layer comprises a combination of differing rough structures.

9. A solar battery cell according to claim 8 wherein the rough areas comprise groups of quadrangular pyramidal projections.

10. A solar battery cell according to claim 8 wherein the rough areas comprise groups of quadrangular pyramidal indentations.

11. A solar battery cell according to claim 8 wherein the rough areas comprise V-shaped channels.

12. A solar battery cell according to claim 3, wherein the electrode formed on the power generation layer is a transparent electrode.

13. A solar battery cell, comprising:

a power generation layer for generating a photoelectric current from incident liqht, the surface of the power generation layer comprising smooth areas and rough areas arranged in a preselected pattern; and an electrode formed on the power generation layer for outputting the photoelectric current to an external load;

wherein said rough areas comprise groups of inclined flat reflecting surfaces for changing the reflection direction of incident light from at least one preselected surface area on the power generation layer surface on which the light is incident, and the electrode is formed on the surface opposite the surface to which light is incident.

14. A solar battery module comprising a plurality of solar battery cells, wherein a photoelectric current generated from light incident upon a power generation layer is obtained by an external load via an electrode formed on the power generation layer, said cells being arrayed on a substrate, which comprises:

a glass cover placed over the plurality of solar battery cells arrayed on said substrate;

a resin filling the space between the glass cover and the substrate; and a frame securing the resin and solar battery cells arrayed between the glass cover and the substrate;

wherein the plurality of arrayed solar battery cells are solar battery cells which reflect the light incidents thereon in different directions.

15. A solar battery module according to claim 14 wherein the solar battery cells comprise means for changing the reflecting direction of the incident light from at least one preselected area of the power generation layer surface on which the light is incident.

16. A solar battery module according to claim 14 wherein the disposition angles of the plural solar battery cells arrayed on the substrate differ.

17. A solar battery module according to claim 14 further comprising coloring or shading in at least one of the constituent components of the solar battery module, including the cover, the frame, and the resin filling the space between the solar battery cells and the substrate.

18. A solar battery module group comprising a planar array of a plurality of solar battery modules, each solar battery module comprising a plurality of solar battery cells wherein photoelectric current generated from light incident upon the power generation layer thereof is obtained by an external load from an electrode formed on the power generation layer, said cells being arrayed on a substrate, a glass cover placed over the plurality of solar battery cells arrayed on said substrate, a resin filling the space between the glass cover and the substrate, and a frame securing the resin and solar battery cells arrayed between the glass cover and the substrate; and characterized by the plurality of arrayed solar battery modules being solar battery modules wherein the component solar battery cells thereof individually reflect the light incident thereon in different directions.

* * * * *